US007365668B2

(12) United States Patent
Mitteregger

(10) Patent No.: US 7,365,668 B2
(45) Date of Patent: Apr. 29, 2008

(54) CONTINUOUS-TIME DELTA-SIGMA ANALOG DIGITAL CONVERTER HAVING OPERATIONAL AMPLIFIERS

(75) Inventor: Gerhard Mitteregger, Taufkirchen (DE)

(73) Assignee: National Semiconductor Germany AG, Unterhaching (DE)

( * ) Notice: Subject to any disclaimer, the term of this patent is extended or adjusted under 35 U.S.C. 154(b) by 0 days.

(21) Appl. No.: 11/656,057

(22) Filed: Jan. 22, 2007

(65) Prior Publication Data
US 2007/0194855 A1      Aug. 23, 2007

(30) Foreign Application Priority Data
Jan. 27, 2006   (DE)  ............... 10 2006 004 012

(51) Int. Cl.
 *H03M 3/00*   (2006.01)
(52) U.S. Cl. ............... 341/143; 341/155; 341/159; 327/552; 327/553; 327/558; 327/559
(58) Field of Classification Search ............... 341/143, 341/155, 159
See application file for complete search history.

(56) References Cited

U.S. PATENT DOCUMENTS

| 5,729,230 | A  | * | 3/1998  | Jensen et al. ............... 341/143 |
| 6,404,367 | B1 | * | 6/2002  | Van der Zwan et al. .... 341/143 |
| 6,584,157 | B1 | * | 6/2003  | Van Der Zwan et al. ... 375/247 |
| 6,897,796 | B2 | * | 5/2005  | Dias et al. ................... 341/143 |
| 7,119,608 | B2 | * | 10/2006 | Doerrer ....................... 327/552 |
| 7,173,485 | B2 | * | 2/2007  | Nagai .......................... 330/107 |
| 2005/0035820 | A1 |   | 2/2005  | Pessl |
| 2005/0206543 | A1 |   | 9/2005  | Draxelmayr |

FOREIGN PATENT DOCUMENTS

| DE | 101 43 770 A1    | 9/2001 |
| DE | 10 2004 009 611 A1 | 1/2006 |

* cited by examiner

*Primary Examiner*—Khai M. Nguyen
(74) *Attorney, Agent, or Firm*—Pearne & Gordon LLP

(57) ABSTRACT

The invention concerns a continuous-time delta-sigma analog-digital converter for the conversion of an analog input signal into a digital output signal, comprising an analog filter which filters the analog input signal and at least one externally circuited operational amplifier (OPAMP) for the formation of an integrator stage, a clock-driven quantizer, which quantizes the filtered analog signal outputted through the analog filter to generate the digital output signal, and a feedback arrangement with at least one digital-analog converter, which supplies to the analog filter at least one feedback signal on the basis of the digital output signal. For the reduction of the necessary amplification-bandwidth product for the operational amplifier (OPAMP) it is stipulated according to the invention that the operational amplifier (OPAMP) has a first amplifier path (gm3) and parallel to this a second amplifier path (gm2, gm5), wherein the transit frequency of the second amplifier path (gm2, gm5) is lower than the transit frequency of the first amplifier path (gm3).

9 Claims, 4 Drawing Sheets

Figure 1:
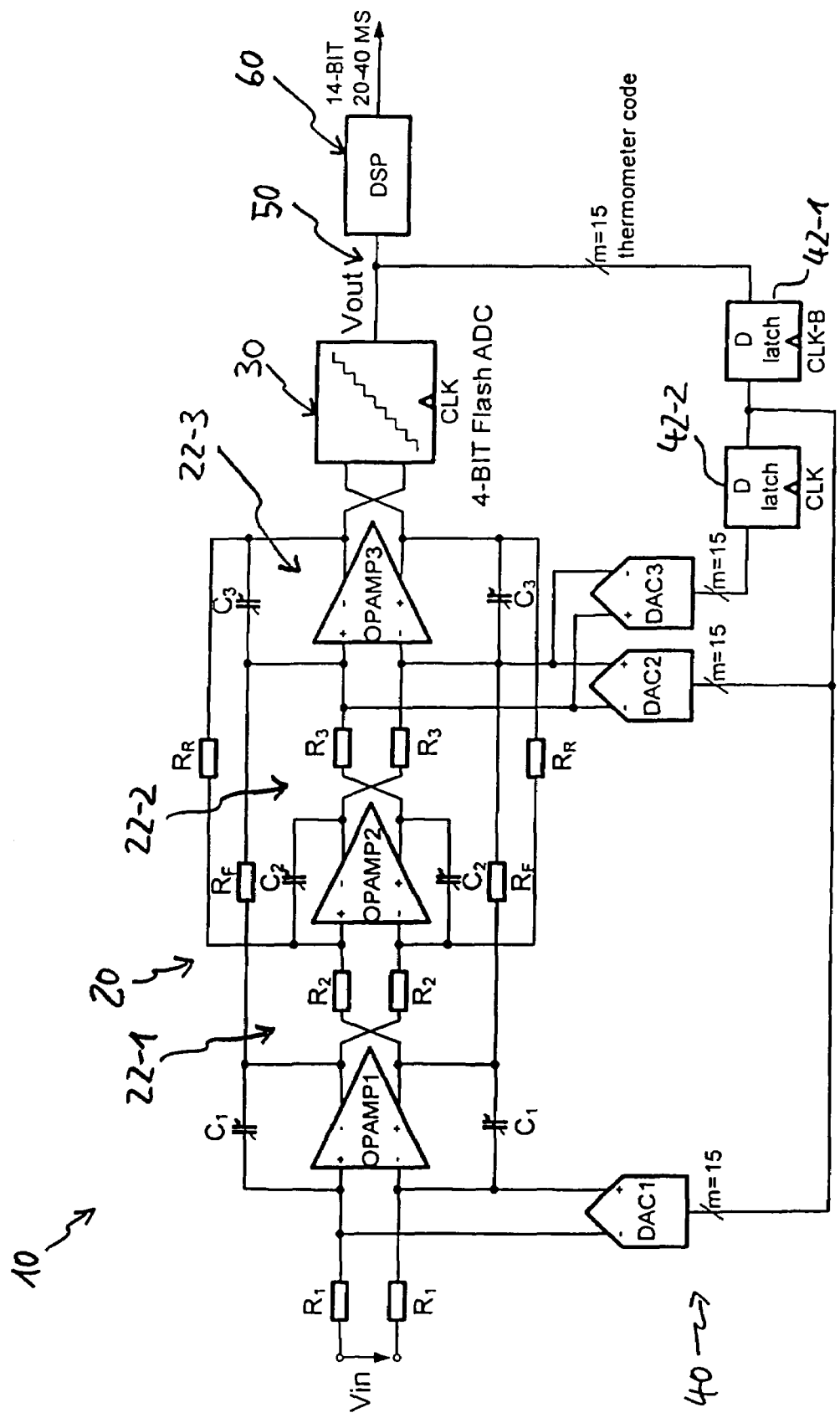

CONTINUOUS-TIME DELTA-SIGMA ANALOG DIGITAL CONVERTER HAVING OPERATIONAL AMPLIFIERS

BACKGROUND TO THE INVENTION

1. Field of the Invention

The present invention concerns a continuous-time delta-sigma analog-digital converter for the conversion of an analog input signal into a digital output signal, comprising:
an analog filter, which filters the analog input signal and has at least one externally circuited operational amplifier for the formation of an integrator stage,
a clock-driven quantiser, which quantises the filtered analog signal outputted by the analog filter for the generation of the digital output signal, and
a feedback arrangement with at least one digital-analog converter, which supplies to the analog filter at least one analog feedback signal on the basis of the digital output signal.

2. Description of the Prior Art

From DE 10 2004 009 611 A1, for example, a converter of this kind is of known art. In this prior art an analog filter for the filtering of the input signal has an integrator that is implemented in terms of an operational amplifier, whose output is fed back via a capacitance to the inverting signal input of the operational amplifier. The design of the operational amplifier is not described in this publication.

A fundamental problem with conventional continuous-time delta-sigma analog-digital converters is that of guaranteeing a sufficiently high transit frequency of the one or more operational amplifiers that are used for the formation of one or a plurality of integrator stages. It is of known art that the amplification (open loop gain) of an operational amplifier decreases at high frequencies with increasing frequency. The frequency at which the amplification of an operational amplifier falls to the value 1 is designated as its "transit frequency". An integrator stage that is implemented in terms of an externally circuited operational amplifier therefore functions reliably only for signal frequencies that are significantly lower than the transit frequency of the operational amplifier used. Expressed in another way, for a prescribed transit frequency, or bandwidth, of an integrator stage, an operational amplifier with a transit frequency that is in comparison significantly higher must be used. Operational amplifiers with a high transit frequency consume however a comparatively large amount of electrical power.

It is an object of the present invention to make available a delta-sigma analog-digital converter of the kind cited in the introduction, which for a prescribed power requirement is suitable for comparatively high signal frequencies, or for a prescribed signal bandwidth possesses a comparatively low power requirement.

In the converter according to the invention it is stipulated that the operational amplifier has a first amplifier path and, in parallel to this, a second amplifier path, wherein the transit frequency of the second amplifier path is lower than the transit frequency of the first amplifier path.

The transit frequency of the second amplifier path is preferably lower by at least a factor 2 than the transit frequency of the first amplifier path.

In a preferred form of embodiment the transit frequency of the first amplifier path is higher than the transit frequency of the integrator stage formed by means of the operational amplifier. These transit frequencies preferably differ by at least a factor 2.

A so-called Bode diagram is particularly well-suited for the graphical representation of the amplification of an operational amplifier, or the amplifications of the amplifier paths, stipulated according to the invention, of an operational amplifier, as a function of the frequency. This takes the form of a log-log plot in which the logarithm of the amplification (e.g. measured in dB) is plotted against the logarithm of the frequency. In such a diagram an essentially linear characteristic typically ensues for the frequency-dependent amplification, which decreases with higher frequencies and at the transit frequency assumes the value 1 (for the amplification) or 0 (for the logarithm of the amplification). When in the following paragraphs mention is made of the "gradient" in a Bode diagram, then what is strictly being referred to is the negative gradient. Correspondingly a "greater gradient" denotes a characteristic for the frequency-dependent amplification that falls off more strongly at higher frequencies.

In a preferred form of embodiment it is stipulated that for frequencies that are lower than the transit frequency of the second amplifier path the gradient of the amplification of the second amplifier path plotted in a Bode diagram is greater by at least a factor 2 than the corresponding gradient for the first amplifier path.

In a particularly simple form of embodiment in terms of circuitry it is stipulated that the second amplifier path is formed from a connection in series of a plurality of amplifier stages.

In a further development of the invention it is stipulated that the operational amplifier has a third amplifier path whose transit frequency is lower than the transit frequency of the second amplifier path. Here too it is particularly favourable if these transit frequencies differ from each other by at least a factor 2. Furthermore for frequencies that are lower than the transit frequency of the third amplifier path, the gradient of the amplification of the third amplifier path plotted in a Bode diagram can be chosen to be greater by at least a factor 2 than the corresponding gradient for the second amplifier path.

In a corresponding manner further amplifier paths with, in each case, a reduced transit frequency can be introduced into the design of the circuitry structure of the operational amplifier. Here too the dimensioning rules formulated above for the first two, or the first three, amplifier paths concerning the transit frequency and/or the gradient of the amplification can once again be stipulated.

If the above noted third amplifier path is stipulated, then this is preferably formed from a connection in series of a number of amplifier stages, this number being greater than the number of amplifier stages of the second amplifier path. If even more amplifier paths are stipulated, then correspondingly further successive increases in the number of amplifier stages for the further amplifying paths can be stipulated.

The particular amplifier path structure stipulated according to the invention enables the implementation of a delta-sigma analog-digital converter with outstanding performance characteristics, e.g. with a signal band ranging up to very high frequencies with, at the same time, a low power requirement and high quality (e.g. linearity) for the output signal. In particular in this connection a form of embodiment is of advantage in which the quantiser has a plurality of quantising stages and/or the digital output signal of the quantiser possesses a thermometer code. In one form of embodiment, for example, the quantiser has 16 quantising stages (corresponding to 4 bits). For both rapid quantisation and also rapid digital-analog conversion in the feedback arrangement it is of advantage if the digital output signal of the quantiser possesses a thermometer code.

In one form of embodiment it is stipulated that the delta-sigma analog-digital converter is of full-differential design.

A preferred manufacturing technology for the delta-sigma analog-digital converter is CMOS technology. The converter can in particular represent a function block of an integrated circuit arrangement.

In a manner known per se the quantiser can be located downstream of a digital processor (DSP) for the further processing of the digital output signal. In this case the digital output signal can be branched off from a circuit node arranged between the quantiser and the digital signal processor and can be supplied to the feedback arrangement.

The features of the above-described forms of embodiment and/or further developments of the invention can of course also advantageously be combined with one another.

SHORT DESCRIPTION OF THE DRAWINGS

Figure 2:
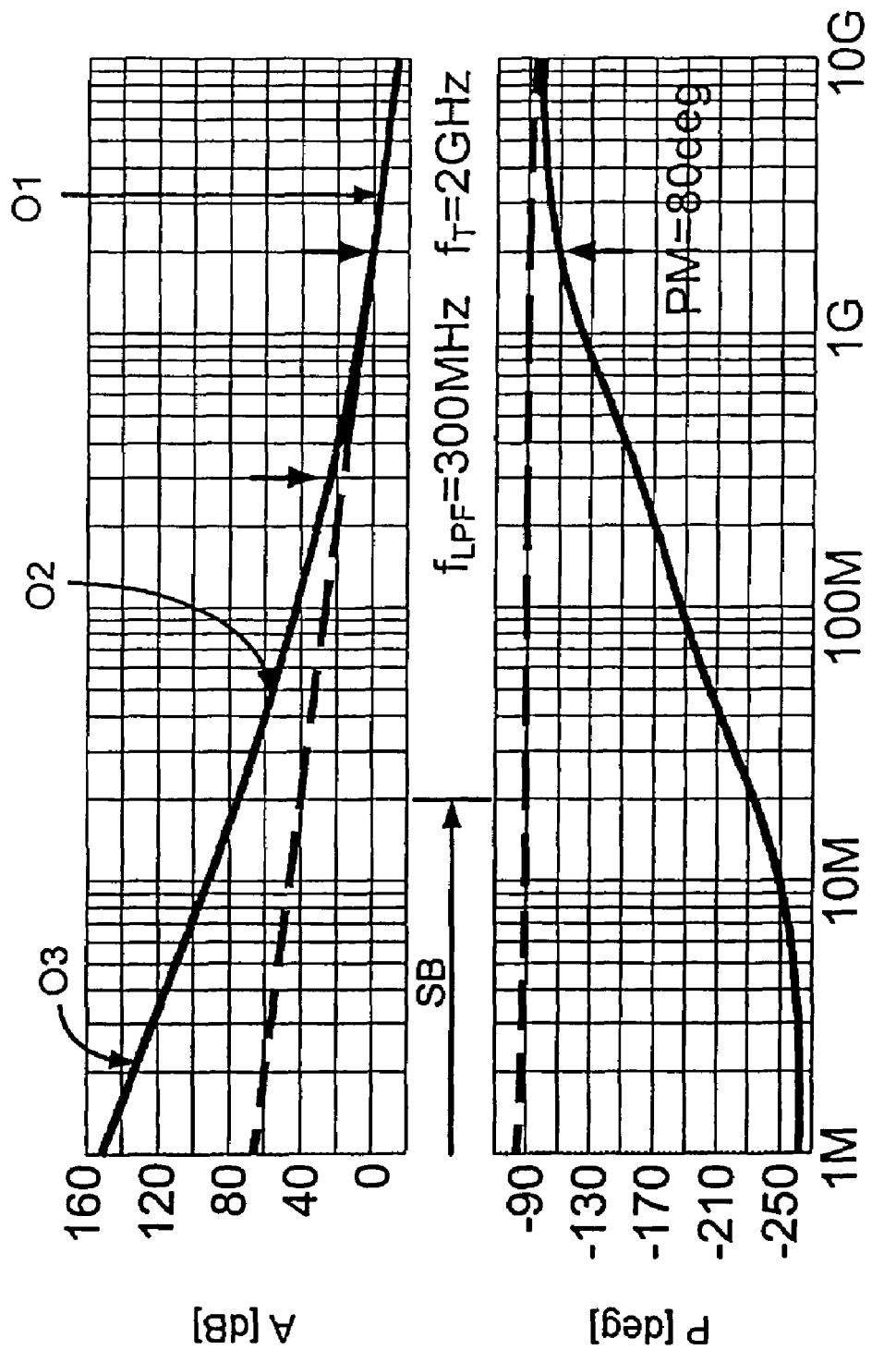
Figure 3:
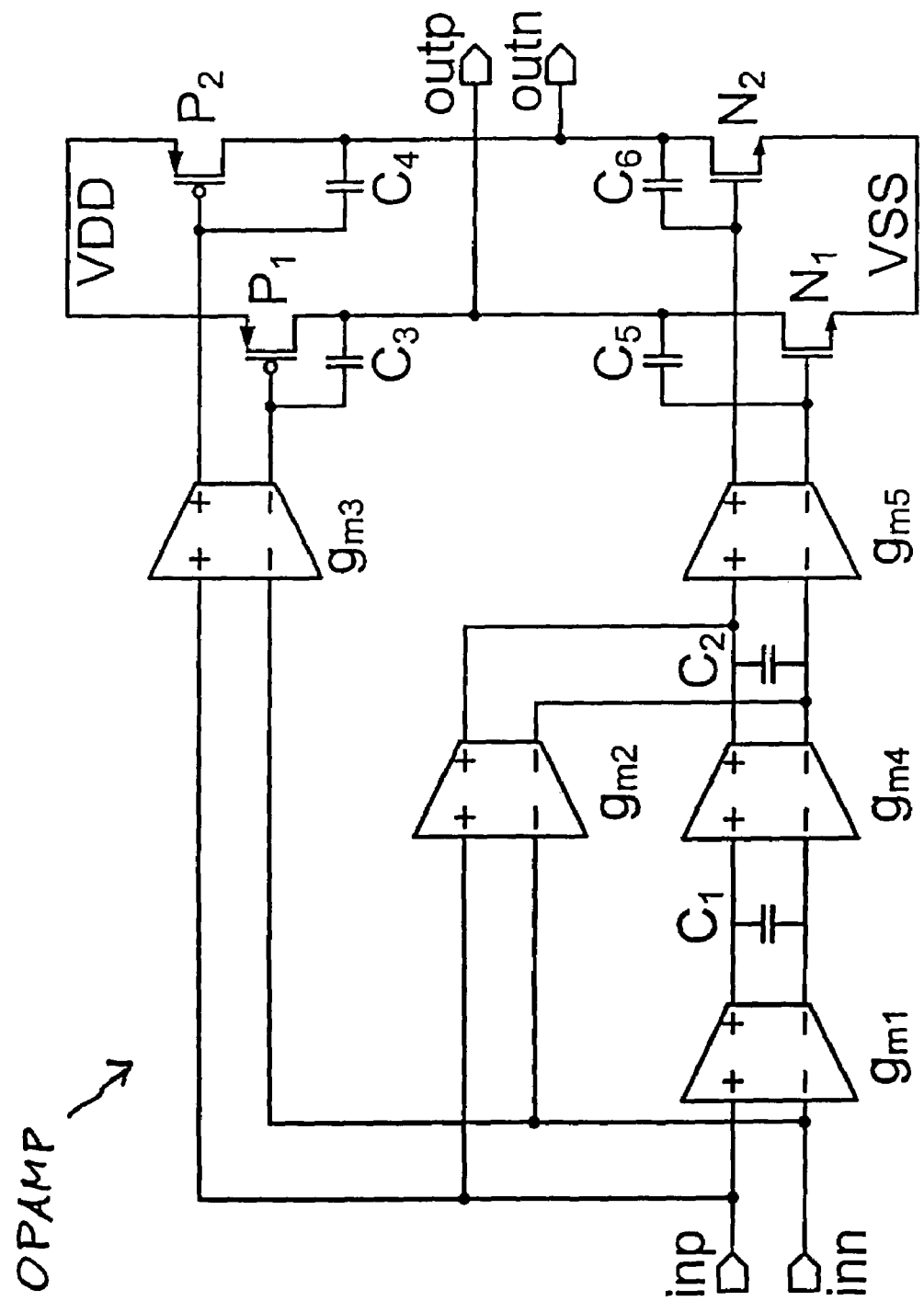
Figure 4:
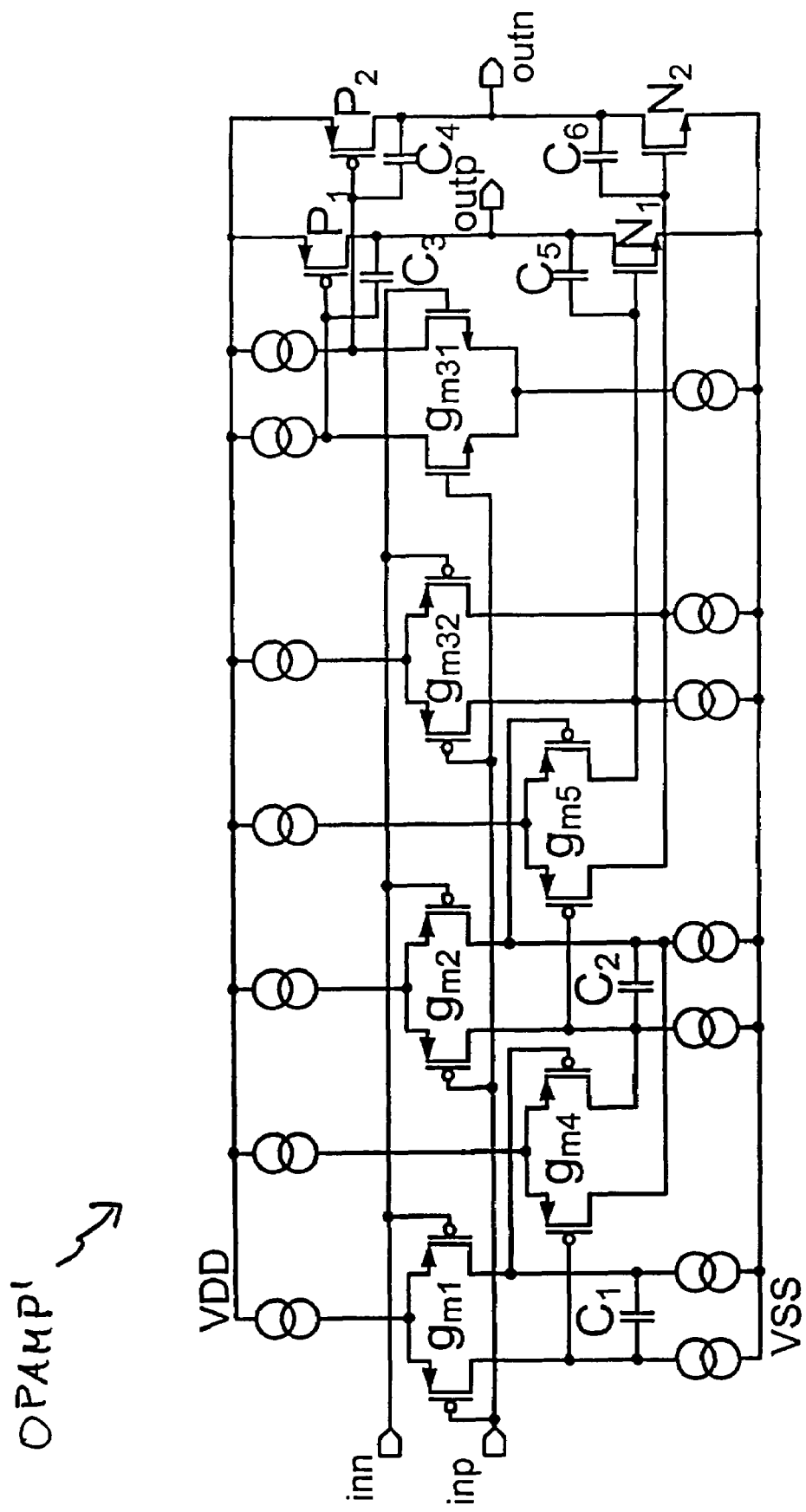

In what follows the invention is further described with the aid of examples of embodiment with reference to the accompanying drawings. In the figures:

FIG. 1 shows a block circuit diagram of a delta-sigma analog-digital converter,

FIG. 2 shows a graphical representation (Bode diagram) of the dependence of an amplification A and a phase P of an operational amplifier on the frequency f, on the one hand for a conventional operational amplifier, and on the other hand for an operational amplifier designed according to the invention, FIG. 3 shows a block circuit diagram to illustrate an operational amplifier structure according to a first form of embodiment, and FIG. 4 shows a detailed circuit diagram of an operational amplifier structure according to a second form of embodiment.

DESCRIPTION OF THE PREFERRED FORM(S) OF EMBODIMENT

FIG. 1 illustrates the design of a delta-sigma analog-digital converter 10 for the conversion of an analog input signal Vin into a digital output signal Vout. The analog input signal Vin is represented by an input voltage and the digital output signal by an output voltage signal.

The converter 10 comprises an analog filter 20 to filter the analog input signal Vin, a 4-bit quantiser 30, clocked by a clock signal, to generate the digital output signal Vout by quantising the signal outputted from the analog filter 20, and a feedback arrangement 40 to feedback analog feedback signals on the basis of the digital output signal Vout.

In completely general terms, in a delta-sigma analog-digital digital converter the integrated ("sigma") difference ("delta") between an analog input signal and an analog representation of the quantised digital output signal is supplied to the quantiser (analog-digital converter stage).

In another embodiment of such a converter, strictly speaking designated as a "delta modulator", the difference ("delta") between an analog input signal and the integral ("sigma") of the quantised digital output signal is supplied to the quantiser. By means of the feedback the quantiser generates an output bit stream, whose time-average value follows the analog input signal. Compared with delta-sigma analog-digital converters working in discrete time, the delta-sigma analog-digital converter working in continuous time offers the advantage of a lower power consumption, or for a prescribed power consumption, the advantage of a higher signal bandwidth.

In the example of embodiment represented the analog filter 20 comprises a plurality of integrators 22-1, 22-2 and 22-3 (an integrator cascade), which form a filter network. The configuration of the filter 20 represented is only to be understood as an example, of course, and can be modified extensively in a manner known per se.

In the implementation represented the integrators 22-1, 22-2 and 22-3 of the analog filter 20 are respectively implemented in terms of suitably externally circuited operational amplifiers OPAMP1, OPAMP2 and OPAMP3. As represented the external circuit consists of suitably dimensioned resistances R and capacitances C.

The quantiser 30 possesses 16 quantising stages and represents the output signal Vout in a thermometer code on 15 output lines, which for the sake of simplicity of the representation of FIG. 1 are symbolised by just a single line connection. For this purpose the quantiser 30 is designed in a manner known per se as a parallel circuit of 15 comparators with 15 comparator thresholds arranged in a "ladder". A common clock signal CLK is supplied simultaneously to the comparators; by means of this signal the respective comparisons of the filtered input signal with the comparator thresholds are performed at discrete-time periodic times, so that a 4-bit output signal Vout is present at the output of the quantiser 30, made available in a clocked manner. The physical representation is carried out according to the thermometer code in 15 digital voltages (symbolised by Vout).

Furthermore one can see in FIG. 1 a digital signal processor (DSP) 60 for the further digital processing of the bit stream outputted from the quantiser 30.

The feedback arrangement 40 of the converter 10 is essentially formed by the circuit components 42-1, 42-2, DAC1, DAC2 und DAC3, which are described in what follows. Each of these components is simply drawn in once in FIG. 1 for the sake of simplicity of representation. In actual fact these components are provided in parallel with one another in a 15-fold embodiment, corresponding to the processing of the signal transmitted via 15 lines in accordance with a thermometer code.

A first feedback path runs from a branch node 52 to the first integrator 22-1 of the analog filter 20 and comprises a clocked digital signal store 42-1, designed as a so-called "latch", and driven by the clock signal CLK (more accurately: by the inverted version CLK-B of the clock signal CLK), to which the digital output signal Vout is supplied, and whose output signal in turn is inputted to the input of a digital-analog converter DAC1. The output signal of the digital-analog converter DAC1 is supplied as a full-differential current signal to the integrator 22-1. In the region of the integrator 22-1 an addition is implemented of the currents provided via coupling resistances R1 and at the output of the digital-analog converter DAC1.

The latch 42-1 is a register, whose output signal follows the input signal if the inputted clock signal CLK-B possesses one particular state of the two possible clock signal states (the clock signal effectively serves as a "permission signal"). With the customary use of a rectangular clock signal CLK, which in the first half of a clock period possesses a logical level "1" and in the second half of the clock period possesses a logical level "0", the output signal Vout ensues at the output of the signal store 42-1, delayed by the half clock period of the clock signal CLK. In terms of circuitry the signal store 42-1 drawn in FIG. 1 in actual fact consists of a parallel arrangement of 15 1-bit signal stores for the parallel delay of the signal level represented on 15 lines.

The output signal Vout, delayed by a half clock period by the signal store 42-1, is also supplied to the input of a digital-analog converter DAC2, which at its output provides a full-differential current signal (corresponding to the result of the digital-analog conversion). The output signal of the digital signal store 42-1 is also inputted to the input of a second digital signal store 42-2, which is designed in the same manner as the first signal store 42-1, but which is driven with the non-inverted clock signal CLK. The second signal store 42-2 delays the signal that it is supplied to it by a further half clock period of the clock signal CLK, so that by connecting in series the signal stores 42-1 and 42-2, acting as delay elements, a version of the output signal Vout is provided at the output of the second signal store 42-2 that is delayed overall by a complete clock period T of the clock signal CLK. This output signal of the second signal store 42-2 is supplied to the input of a digital-analog converter DAC3 which (in the same manner as the digital-analog converter DAC2) delivers a full-differential current signal which, in the same manner as the output signal of the digital-analog converter DAC2, is stored in the region of the integrator 22-3.

The two signal stores 42-1, 42-2 and the two digital-analog converters DAC2, DAC3 together form a function block of the feedback arrangement 40, generating a feedback signal corresponding to the differentiated output signal Vout of the quantiser 30. The generation of this differentiated signal is here based on the analog subtraction of two signals, which, starting from the digital output signal, are provided by the provision of different delays and a digital-analog conversion in each case.

For each of the operational amplifiers OPAMP1, OPAMP2 and OPAMP3 an amplification characteristic (frequency-dependent amplification) should be implemented to guarantee the desired function of the integrator stage 22-1, 22-2 or 22-3 respectively formed with them.

FIG. 2 illustrates in an exemplary manner amplification characteristics, on the one hand for a conventional operational amplifier (dashed lines) and on the other hand for an operational amplifier modified for use in the converter 10 according to the invention (solid lines).

The particular feature of the amplification characteristic described in what follows is stipulated for at least one of the operational amplifiers of the converter 10, preferably however for a plurality of operational amplifiers, in particular for all operational amplifiers that are introduced for the formation of integrator stages in the converter.

In the upper part of FIG. 2 the logarithm of the amplification A is plotted against the logarithm of the frequency f. In the lower part of FIG. 2 the phase behaviour of the output signal of the operational amplifier concerned is represented. SB indicates the signal band of the delta-sigma analog-digital converter concerned.

As can be seen from FIG. 2, an approximately linear behaviour for the amplification ensues for a conventional operational amplifier (dashed lines), which reduces with increasing frequency and is usable up to the transit frequency of the operational amplifier, which in the example represented lies at approximately 2 GHz. The phase P of the output signal of the operational amplifier is essentially constant over the usable frequency range and lies at approximately −90°.

It is assumed that the transit frequency of the integrator stage formed with this operational amplifier lies at approximately 300 MHz, that is to say, at a frequency that is significantly lower than the transit frequency of the operational amplifier, so that trouble-free functioning of the integrator stage is guaranteed.

The amplifier characteristic of the conventional operational amplifier is prescribed by a "first order amplification characteristic" O1, which is characterised by its transit frequency and its gradient.

The basic idea of the invention consists in stipulating an amplification characteristic for the operational amplifier used in the formation of the integrator stage in which on the one hand a high transit frequency is given, and on the other hand a comparatively large amplification is achieved for the range of frequencies extending from the transit frequency to lower frequencies. The behaviour of the amplification characteristic ensuing in the invention is represented in FIG. 2 in an exemplary manner (solid lines), and possesses sections with different gradients that are designated in the figure by O1, O2 and O3.

This particular characteristic is achieved in terms of circuitry in that the operational amplifier concerned possesses a plurality of (here: three) amplifier paths, which possess different transit frequencies and act together to attain the characteristic represented in FIG. 2.

FIG. 3 shows such an implementation in terms of circuitry of an operational amplifier OPAMP in a full-differential embodiment with input connections inp, inn and output connections outp, outn. In the left-hand part of the circuit diagram can be seen an input stage formed from transconductance stages gm1 to gm5, which drives an output stage represented in the right-hand part of the figure.

The operational amplifier OPAMP, whose structure as already noted above can be used for each of the operational amplifiers OPAMP1, OPAMP2, OPAMP3 represented in FIG. 1, has a first amplifier path formed by the transconductance stage gm3, with a particular transit frequency that is designated in what follows as a "first transit frequency". This amplifier path dominates the amplification characteristic represented in FIG. 2 in the region O1.

In parallel to the first amplifier path the operational amplifier OPAMP also has a second amplifier path that is formed by a connection in series of the transconductance stages gm2 and gm5, and overall has a transit frequency that in what follows is designated as a "second transit frequency", and is significantly lower than the first transit frequency. In the example represented the transit frequency of the transconductance stage gm5 is approximately as high as the first transit frequency. The transit frequency of the combination of gm2 and gm5 is however definitively determined by what is in comparison the significantly lower transit frequency of the transconductance stage gm2.

The second amplifier path gm2, gm5 dominates the amplification characteristic represented in FIG. 2 in the region O2.

Finally the operational amplifier OPAMP in the example represented also has a third amplifier path, which is formed by the connection in series of the transconductance stages gm1, gm4 and gm5, and possesses an even further lowered transit frequency, in what follows designated as a "third transit frequency". The transconductance stage gm4 in fact possesses approximately the same transit frequency as the transconductance stage gm2, but the transit frequency of the upstream transconductance stage gm1 is significantly lower in comparison.

The third amplifier path gm1, gm4, gm5 dominates the amplification characteristic represented in FIG. 2 in the region O3.

An advantageous, but not mandatory, particularity of the structure represented in FIG. 3 consists in the fact that the transconductance stage gm5 forms a component of both the second amplifier path and also the third amplifier path.

FIG. 4 shows a detailed circuit diagram of an operational amplifier OPAMP' according to a further form of embodiment in which an implementation of the transconductance stages in terms of circuitry known per se is illustrated by transistor pairs, and, in a deviation from the embodiment according to FIG. 3, a transconductance stage gm3 acts on both output paths of the output stage represented in the right-hand part of FIG. 4. Otherwise the structure and the function of the operational amplifier OPAMP' corresponds to the operational amplifier already described with reference to FIG. 3.

Although the structure of the operational amplifier stipulated in the invention as such is of known art, for example as a "multi-stage" or "multi-path" structure, the use of this structure within the framework of the delta-sigma analog-digital conversion delivers a substantial improvement in the performance characteristics of the converter concerned. The particular integrator design allows a reduction in the necessary amplification-bandwidth product for the operational amplifier, or, for a prescribed amplification-bandwidth product, the implementation of integrators with a greater bandwidth and a lesser phase displacement. In particular operational amplifiers can be implemented with a transit frequency at least approximately twice as high, in particular with a transit frequency higher by a factor of 5, with reference to the integrator bandwidth. The value of the phase displacement can be held near 90°. The particular combination of amplifier paths stipulated according to the invention offers a significantly greater amplification in the range of the integrator bandwidth than was the case for conventional circuitry arrangements.

The invention claimed is:

1. A continuous-time delta-sigma analog-digital converter (10) for the conversion of an analog input signal (Vin) into a digital output signal (Vout), comprising:
    an analog filter (20), which filters the analog input signal and has at least one externally circuited (R, C) operational amplifier (OPAMP1, OPAMP2, OPAMP3) for the formation of an integration stage (22-1, 22-2, 22-3),
    a clock-driven quantiser (30), which quantises the filtered analog signal outputted by the analog filter (20) for the generation of the digital output signal, and
    a feedback arrangement (40) with at least one digital-analog converter (DAC1, DAC2, DAC3), which supplies to the analog filter (20) at least one analog feedback signal on the basis of the digital output signal (Vout), characterised in that the operational amplifier (OPAMP1, OPAMP2, OPAMP3) has a first amplifier path (gm3) and parallel to this a second amplifier path (gm2, gm5), wherein the transit frequency of the second amplifier path (gm2, gm5) is lower than the transit frequency of the first amplifier path (gm3).

2. The converter according to claim 1, wherein the transit frequency of the first amplifier path (gm3) is higher than the transit frequency of the integrator stage (22-1, 22-2, 22-3) formed by means of the operational amplifier (OPAMP1, OPAMP2, OPAMP3).

3. The converter according to claim 1, wherein for frequencies that are smaller than the transit frequency of the second amplifier path (gm2, gm5) the gradient of the amplification of the second amplifier path (gm2, gm5) plotted in a Bode diagram is greater by a factor of at least 2 than the corresponding gradient for the first amplifier path (gm3).

4. The converter according to claim 1, wherein the second amplifier path (gm2, gm5) is formed from a connection in series of a plurality of amplifier stages.

5. The converter according to claim 1, wherein the operational amplifier (OPAMP1, OPAMP2, OPAMP3) has a third amplifier path (gm1, gm4, gm5) whose transit frequency is lower than the transit frequency of the second amplifier path (gm2, gm5).

6. The converter according to claim 5, wherein for frequencies that are smaller than the transit frequency of the third amplifier path (gm1, gm4, gm5) the gradient of the amplification of the third amplifier path (gm1, gm4, gm5) plotted in a Bode diagram is greater by a factor of at least 2 than the corresponding gradient for the second amplifier path (gm2, gm5).

7. The converter according to claim 5, wherein the third amplifier path (gm1, gm4, gm5) is formed from a connection in series of a number of amplifier stages, this number being greater than the number of amplifier stages of the second amplifier path (gm2, gm5).

8. The converter according to claim 1, wherein the quantiser (30) has a plurality of quantising stages.

9. The converter according to claim 1, wherein the digital output signal (Vout) of the quantiser (30) possesses a thermometer code.

* * * * *